(12) United States Patent
Kim et al.

(10) Patent No.: US 8,373,163 B2
(45) Date of Patent: Feb. 12, 2013

(54) OXIDE SEMICONDUCTOR AND THIN FILM TRANSISTOR INCLUDING THE SAME

(75) Inventors: Chang-jung Kim, Yongin-si (KR); Sang-wook Kim, Yongin-si (KR); Jin-seong Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 328 days.

(21) Appl. No.: 12/453,962

(22) Filed: May 28, 2009

(65) Prior Publication Data
US 2010/0044700 A1 Feb. 25, 2010

(30) Foreign Application Priority Data
Aug. 19, 2008 (KR) .................. 10-2008-0081073

(51) Int. Cl.
*H01L 29/10* (2006.01)
(52) U.S. Cl. ........... 257/43; 257/57; 257/E29.1; 438/85; 438/104
(58) Field of Classification Search ............ 257/43
See application file for complete search history.

(56) References Cited

U.S. PATENT DOCUMENTS
| 6,281,429 | B1 * | 8/2001 | Takada et al. | 136/256 |
| 2008/0079685 | A1 * | 4/2008 | Umezaki et al. | 345/100 |
| 2008/0237598 | A1 * | 10/2008 | Nakayama | 257/59 |

FOREIGN PATENT DOCUMENTS
JP 2007059834 A * 3/2007

OTHER PUBLICATIONS

Daily, James. Packaging of Electronic Systems. 1990. McGraw-Hill Publishing Company. pages 129-135.*
Chen, J.T. et al. The effect of La doping concentration on the properties of zinc oxide films prepared by the sol-gel method. Science Direct—Journal of Crystal Growth, Jan. 17, 2008, pp. 2627-2632.*

* cited by examiner

*Primary Examiner* — Ajay K Arora
(74) *Attorney, Agent, or Firm* — Harness, Dickey & Pierce, P.L.C.

(57) ABSTRACT

Disclosed are an oxide semiconductor and a thin film transistor (TFT) including the same. The oxide semiconductor may include a lanthanoid (Ln) added to zinc oxide (ZnO) and may be used as a channel material of the TFT.

20 Claims, 4 Drawing Sheets

OXIDE SEMICONDUCTOR AND THIN FILM TRANSISTOR INCLUDING THE SAME

PRIORITY STATEMENT

This application claims priority under 35 U.S.C. §119 to Korean Patent Application No. 10-2008-0081073, filed on Aug. 19, 2008, in the Korean Intellectual Property Office (KIPO), the entire contents of which are incorporated herein by reference.

BACKGROUND

1. Field

Example embodiments relate to an oxide semiconductor obtained by adding a new material to zinc oxide (ZnO), and a thin film transistor (TFT) including the same.

2. Description of the Related Art

Thin film transistors (TFTs) are used in various application fields, for example, as switching and driving devices of display apparatuses and as selection switches of cross-point type memory devices.

Currently, while liquid crystal display (LCD) apparatuses are mainly used as display panels in televisions (TVs), a relatively large amount of research on organic light-emitting display (OLED) apparatuses that may also be applied to TVs is being conducted. TV display technologies are being developed according to demands of the market. Such demands include demand for large-scaled TVs or digital information display (DID) apparatuses, lower price, and high definition (high resolution, improved color rendition, brightness, contrast characteristics, and high color reproducibility). In order to satisfy these demands, substrates, e.g., glass substrates, are required to become larger, and TFTs used as switching and driving devices of display apparatuses are required to have a higher performance.

An example of a TFT used as a switching or driving device of a display apparatus is an amorphous silicon (a-Si) TFT which may be uniformly formed on a large substrate over 2 m in length at a lower cost, and is the most widely used TFT. However, TFTs are required to have improved performance as display apparatuses require high-definition characteristics and larger sizes, and thus, the display apparatuses are regarded as being limited by the operating capabilities of typical a-Si TFTs having a mobility of about 0.5 cm$^2$/Vs. Thus, a high-performance TFT having a higher mobility than an a-Si TFT, and a technology of manufacturing the high-performance TFT are required.

A polysilicon (poly-Si) TFT having a much higher performance than an a-Si TFT has an increased mobility of several tens to several hundred cm$^2$/Vs, and thus, may have a sufficiently high performance to be applied to high-definition display apparatuses which are not easily implemented by using a-Si TFTs. Also, poly-Si TFTs have less device characteristic deterioration than a-Si TFTs. However, the process of manufacturing poly-Si TFTs is more complicated than that of a-Si TFTs, and thus, additional costs increase. Although a poly-Si TFT may be appropriately applied to a high-definition display apparatus or an OLED apparatus, application of poly-Si TFTs is limited due to increased costs compared with a-Si TFTs. Also, poly-Si TFTs have not been implemented on relatively large substrates over 1 m in size until now due to manufacturing equipment limitations or uniformity defects, and thus, may not be easily applied to TV products.

Accordingly, a TFT having advantages of both a-Si TFTs and poly-Si TFTs is required, and research is being actively conducted into such a TFT. A representative example of such a device is an oxide semiconductor device. Among oxide semiconductor devices, zinc oxide (ZnO)-based TFTs are currently attracting attention. ZnO-based materials, e.g., ZnO, indium-zinc oxide (IZO), or ZnO or IZO in which, for example, gallium (Ga), magnesium (Mg), aluminum (Al), or iron (Fe) is doped, have been introduced. A ZnO-based semiconductor device may be manufactured through a low-temperature process and has an amorphous phase, and thus, may be more easily implemented on a relatively large substrate. Also, a ZnO-based TFT has increased mobility and has an improved electric characteristic similar to the poly-Si TFT. Currently, research is being conducted in order to use an oxide semiconductor material layer having increased mobility, for example, a ZnO-based material layer, in a channel area of a TFT.

SUMMARY

Example embodiments include an oxide semiconductor obtained by adding a new material to zinc oxide (ZnO). Example embodiments include an oxide thin film transistor (TFT) in which the oxide semiconductor is used in a channel area. Additional aspects will be set forth in part in the description which follows and, in part, will be apparent from the description, or may be learned by practice of example embodiments.

According to example embodiments, an oxide semiconductor may include a lanthanoid (Ln) added to a zinc oxide (ZnO)-based material. The lanthanoid (Ln) may include at least one selected from the group consisting of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and mixtures including at least one of the foregoing. In the oxide semiconductor, a composition ratio of the lanthanoid (Ln) with respect to a total content of the ZnO-based material and the lanthanoid (Ln) may be about 0 at %<Ln(at %)≦15 at %.

The ZnO-based material may include ZnO, indium-zinc oxide (IZO), or gallium-indium-zinc oxide (GIZO). The ZnO-based material may include IZO and the lanthanoid (Ln) may include La. In the oxide semiconductor, a composition ratio of lanthanum (La) with respect to a total content of indium (In), zinc (Zn), and lanthanum (La) may be about 0 at %<La(at %)≦11.4 at %. In the oxide semiconductor, a composition ratio of indium (In) may be about 53.5 at %<In(at %)≦55.5 at %. in the oxide semiconductor, a composition ratio of zinc (Zn) may be about 34.2 at %≦Zn(at %)<46.5 at %. The oxide semiconductor may be amorphous, partially crystalline, or crystalline. The oxide semiconductor may further include a Group I element, a Group II element, a Group III element, a Group IV element, or a Group V element.

According to example embodiments, an oxide thin film transistor (TFT) may include a gate, a channel configured to correspond to the gate and may include an oxide semiconductor including a lanthanoid (Ln) added to a zinc oxide (ZnO)-based material, a gate insulating layer between the gate and the channel, and a source and a drain configured to contact both sides of the channel, respectively.

The oxide semiconductor may be amorphous, partially crystalline, or crystalline. The oxide semiconductor may further include a Group I element, a Group II element, a Group III element, a Group IV element, or a Group V element.

BRIEF DESCRIPTION OF THE DRAWINGS

Example embodiments will be more clearly understood from the following detailed description taken in conjunction with the accompanying drawings. FIGS. 1-4 represent non-limiting, example embodiments as described herein.

FIGS. 1 and 2 are cross-sectional views of thin film transistors (TFTs) each including an oxide semiconductor, according to example embodiments;

FIG. 4 is a graph showing a correlation between a gate voltage Vg and a drain current Id of an oxide TFT including zinc oxide (ZnO) and lanthanum (La) as a channel material, according to example embodiments.

Figure 1:
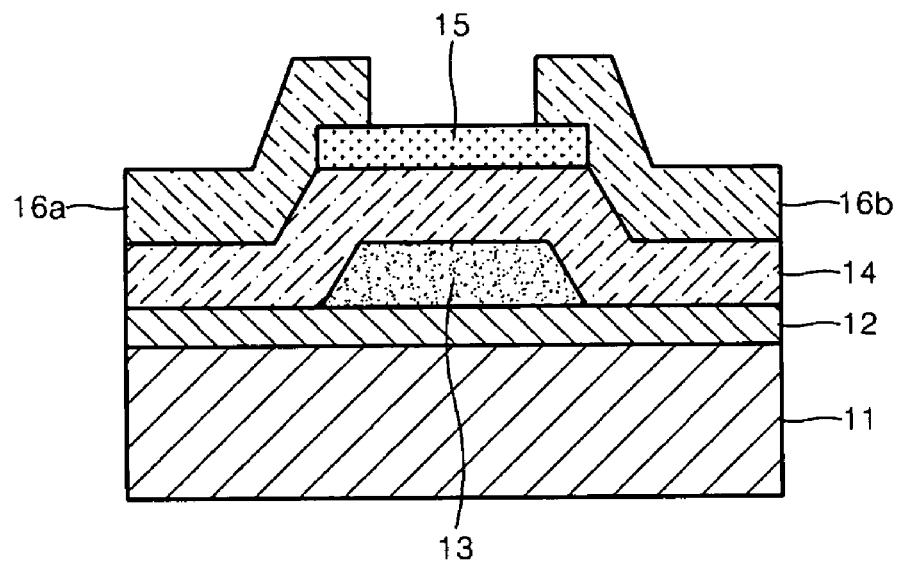

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Reference will now be made in detail to example embodiments, examples of which are illustrated in the accompanying drawings, wherein like reference numerals refer to the like elements throughout. In this regard, example embodiments may have different forms and should not be construed as being limited to the descriptions set forth herein. Accordingly, example embodiments are merely described below, by referring to the figures, to explain aspects of example embodiments. In the drawings, the thicknesses and the widths of layers are exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms including technical and scientific terms used herein have the same meaning as commonly understood by one of ordinary skill in the art to which example embodiments belongs. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

An oxide semiconductor according to example embodiments may be formed by adding a lanthanoid (Ln) to a zinc oxide (ZnO)-based material, e.g., ZnO, indium-zinc oxide (IZO), or gallium-indium-zinc oxide (GIZO). IZO may include, for example, indium (In), and zinc (Zn), and each of indium (In) and zinc (Zn) may be bonded with oxygen (O) as in indium oxide ($In_2O_3$), and ZnO. GIZO may include, for example, at least gallium (Ga), indium (In), and zinc (Zn), and each of gallium (Ga), indium (In), and zinc (Zn) may be bonded with oxygen (O) as in gallium oxide ($Ga_2O_3$), $In_2O_3$, and ZnO, or a mixture of two or three of gallium (Ga), indium (In), and zinc (Zn) may share oxygen (O). The lanthanoid (Ln) may be selected from the group consisting of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and mixtures including at least one of the foregoing. Also, the lanthanoid (Ln) may be bonded with O or may share O with a mixture of two or three of Ga, In, and Zn.

The oxide semiconductor formed by adding the lanthanoid (Ln) to the ZnO-based material may be amorphous, partially crystalline, or crystalline. Examples of the lanthanoid (Ln) are La(1.1), Ce(1.12), Pr(1.13), Nd(1.14), Pm(0.94), Sm(1.17), Eu(1.2), Gd(0.94), Tb(1.22), Dy(1.23), Ho(1.24), Er(1.25), Tm(0.96), and Yb(1.27). The numbers in brackets represent electronegativity. Electronegativity represents the ability of an atom in a molecule to attract electrons towards itself in the atom's bond. In an ionic bond, some atoms have larger electronegativities and others have smaller electronegativities. An ionic bond may be formed by moving electrons from one atom to another.

As described above, all examples of the lanthanoid (Ln) have electronegativities less than 1.3 and have electronegativity differences greater than 2.2 from O having an electronegativity of 3.5, thereby forming an oxide in a strong ionic bond. Zinc (Zn) has an electronegativity of 1.6 and has an electronegativity difference of 1.9 from O. That is, zinc (Zn) has characteristics of both a covalent bond and an ionic bond. Thus, the characteristics of the ionic bond may become stronger by adding lanthanoid (Ln) to the ZnO-based material.

Hydrogenated amorphous silicon (a-Si:H) forms a covalent bond. In a covalent bond, if an $Sp^3$ coordinate bond is formed with directivity so as to be amorphous, an electron cloud forming an oxygen bond may be distorted. Accordingly, a weak bond may be formed. If a thin film transistor (TFT) having the above bonding structure is driven for a long time, electrons or holes may be accumulated in a bonding area. As a result, the bond may be broken and a threshold voltage Vth may vary, thereby causing reliability problems. On the other hand, in an ionic bond, cations may form a large electron cloud so as to overlap each other regardless of a bond of O anions, a weak bond does not exist regardless of a crystalline or amorphous phase, and thus, threshold voltage Vth variation hardly exists or is relatively small. Thus, ionic bonds are regarded as contributing to the manufacture of highly reliable TFTs. According to example embodiments, transistor characteristics may be more easily controlled due to the above-described ionic bond formed in most parts of the oxide semiconductor formed by adding the lanthanoid (Ln) to the ZnO-based material. However, all bonds do not need to be ionic bonds. According to example embodiments, a composition ratio of the lanthanoid (Ln) in the oxide semiconductor may be about 0at %<Ln(at %)≦15 at %.

Group I elements, e.g., lithium (Li) and potassium (K), Group II elements, e.g., magnesium (Mg), calcium (Ca), and strontium (Sr), Group III elements, e.g., Ga, aluminum (Al), In, and yttrium (Y), Group IV elements, e.g., titanium (Ti), zirconium (Zr), silicon (Si), tin (Sn), and germanium (Ge), and Group V elements, e.g., tantalum (Ta), vanadium (V), niobium (Nb), and antimony (Sb), may be additionally included in the oxide semiconductor according to example embodiments.

The oxide semiconductor according to example embodiments may be used as a channel material of a driving transistor of a liquid crystal display (LCD) apparatus or an organic light-emitting display (OLED) apparatus, or may be used as a channel material of a selection transistor, a transistor forming a peripheral circuit of a memory device, or an oxide inverter.

Figure 2:
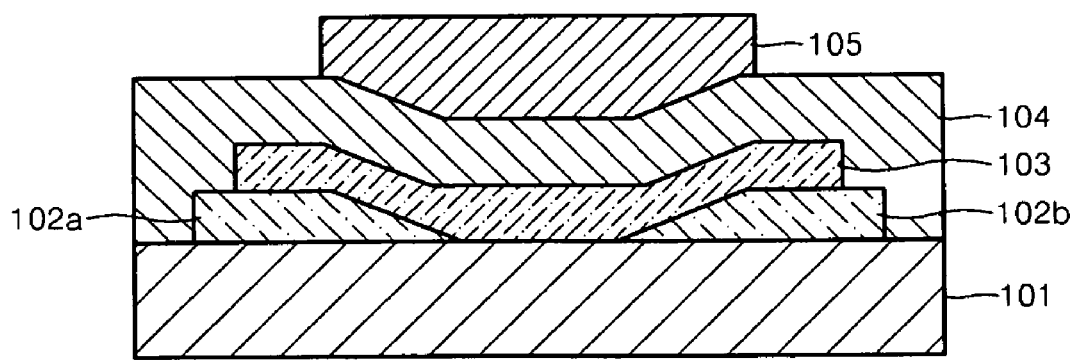

FIGS. 1 and 2 are cross-sectional views of TFTs each including an oxide semiconductor, according to example embodiments. FIG. 1 illustrates a bottom gate TFT and FIG. 2 illustrates a top gate TFT. Hereinafter, a TFT including an oxide semiconductor is referred to as an oxide TFT.

Referring to FIG. 1, an oxide TFT according to example embodiments may include a gate 13 formed on a portion of a substrate 11, and a gate insulating layer 14 formed on the substrate 11 and the gate 13. The substrate 11 may be formed of Si. If the substrate 11 is formed of Si, an oxide layer 12 may be further formed on a surface of the substrate 11 through a thermal oxidation process. A channel 15 may be formed on a portion of the gate insulating layer 14 corresponding to the gate 13, and a source and a drain 16a and 16b may be formed on both sides of the channel 15 on the gate insulating layer 14, respectively.

Referring to FIG. 2, in an oxide TFT according to example embodiments, a source and a drain 102a and 102b may be formed on a substrate 101, and a channel 103 may be formed between the source and the drain 102a and 102b. The substrate 101 may be formed of Si. A gate insulating layer 104 may be formed on the channel 103 and the substrate 101, and a gate 105 may be formed on a portion of the gate insulating layer 104 corresponding to the channel 103. If the substrate 101 is formed of Si, an oxide layer (not shown) may be further formed on a surface of the substrate 101 through a thermal oxidation process. Materials forming the layers of the oxide TFTs illustrated in FIGS. 1 and 2 will now be described in detail.

The substrates 11 and 101 may be formed of a material that is used in conventional semiconductor devices, for example, Si, glass, or an organic material. The oxide layer 12 formed on the substrate 11 may be a silicon oxide ($SiO_2$) layer formed by performing a thermal oxidation process on a silicon substrate. The gates 13 and 105 may be formed of a conductive material, for example, a metal, e.g., titanium (Ti), platinum (Pt), ruthenium (Ru), gold (Au), silver (Ag), molybdenum (Mo), aluminum (Al), tungsten (W), or copper (Cu), or a conductive oxide, e.g., IZO or aluminum-zinc oxide (AZO). The gate insulating layers 14 and 104 may be formed of an insulating material that is used in conventional semiconductor devices, for example, $SiO_2$, a high-K material, e.g., hafnium oxide ($HfO_2$), aluminum oxide ($Al_2O_3$), or silicon nitride ($Si_3N_4$) having a higher dielectric constant than $SiO_2$, or a mixture thereof. The sources and drains 16a and 102a, and 16b and 102b may be formed of a conductive material, for example, a metal, e.g., Ti, Pt, Ru, Au, Ag, Mo, Al, W, or Cu, or a conductive oxide, e.g., IZO or AZO.

Figure 3A:
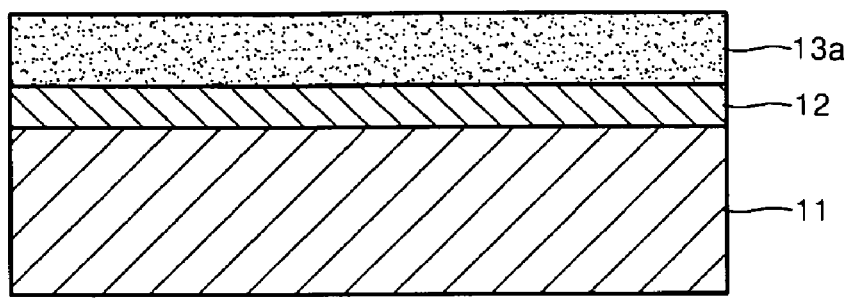
FIGS. 3A through 3E are diagrams illustrating a method of manufacturing an oxide TFT, according to example embodiments.

FIGS. 3A through 3E are diagrams illustrating a method of manufacturing an oxide TFT, according to example embodiments. Referring to FIG. 3A, a substrate 11 may be prepared. The substrate 11 may be formed of Si, glass, or an organic material. If the substrate 11 is formed of Si, an oxide layer 12 may be formed on a surface of the substrate 11 through a thermal oxidation process. A conductive material 13a, e.g., a metal or a conductive metal oxide, may be coated on the substrate 11.

Figure 3B:
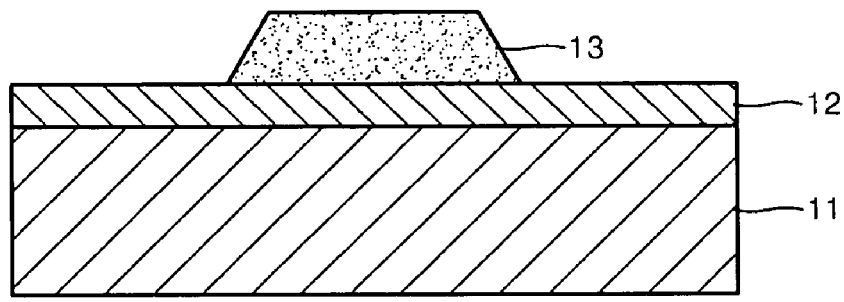
Figure 3C:
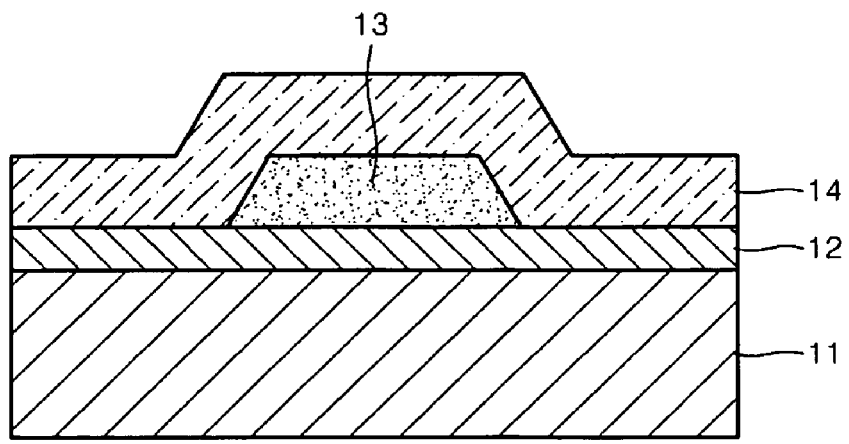

Referring to FIG. 3B, a gate 13 may be formed by patterning the conductive material 13a. Referring to FIG. 3C, a gate insulating layer 14 may be formed by coating an insulating material on the gate 13 and patterning the insulating material. The gate insulating layer 14 may be formed of $SiO_2$, $Si_3N_4$, $HfO_2$, $Al_2O_3$, or a mixture of $HfO_2$ and $Al_2O_3$.

Figure 3D:
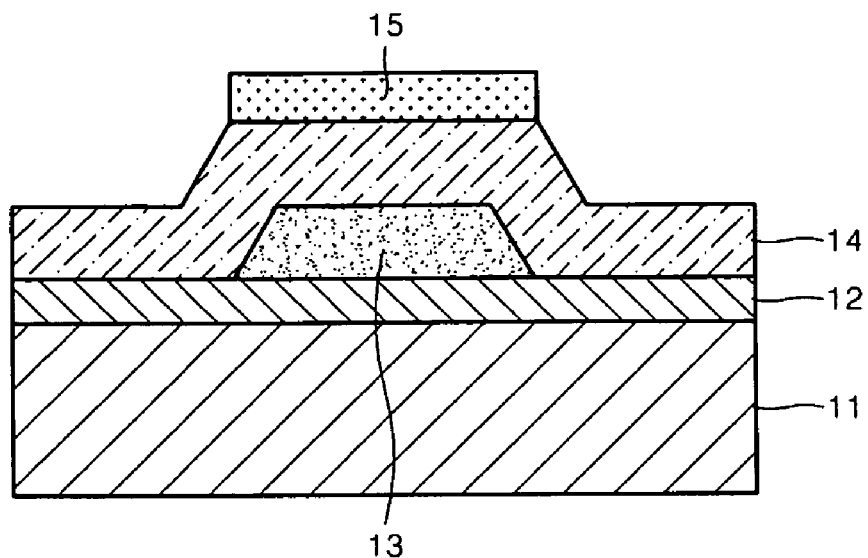

Referring to FIG. 3D, a channel 15 may be formed by coating a channel material on the gate insulating layer 14 through, for example, a physical vapor deposition (PVD) process, a chemical vapor deposition (CVD) process, or an atomic layer deposition (ALD) process, and patterning the channel material so as to retain the channel material on a portion of the gate insulating layer 14 corresponding to the gate 13. According to example embodiments, the channel 15 may be formed by adding a lanthanoid (Ln) to a ZnO-based material. If the channel 15 is formed through a sputtering process, a target formed of at least one of ZnO, IZO, and GIZO and a target formed of lanthanoid (Ln) are put into a chamber, and the channel 15 may be formed through a co-sputtering process. Alternatively, a single target including both the ZnO-based material and the lanthanoid (Ln) may be used. An oxide semiconductor formed by adding the lanthanoid (Ln) to the ZnO-based material may be amorphous, partially crystalline, or crystalline.

Figure 3E:
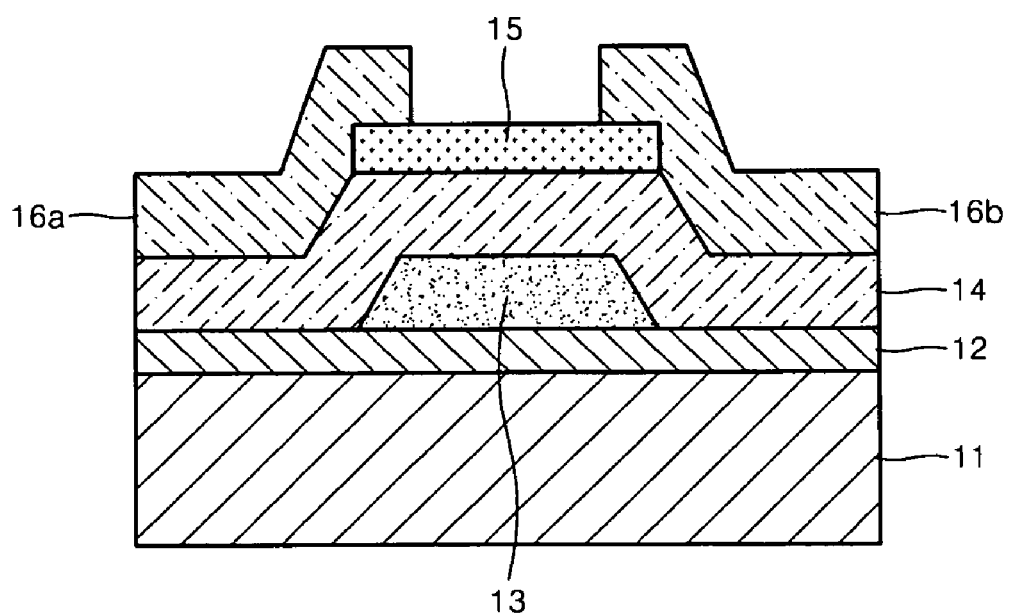

Referring to FIG. 3E, a conductive material, e.g., a metal or a conductive metal oxide, may be coated on the channel 15 and the gate insulating layer 14, and the conductive material may be patterned so as to form a source 16a and a drain 16b connected to both sides of the channel 15, respectively. A heat treatment process may be performed at a temperature of about 400° C. or less by using a conventional furnace annealing method, a rapid thermal annealing method, a laser annealing method, or a hot plate annealing method.

Manufacturing Example

A substrate including a $SiO_2$ layer formed to a thickness of about 100 nm on a surface of a silicon substrate was prepared. A gate formed of Mo was formed to a thickness of about 200 nm on a surface of the substrate, and a gate insulating layer was formed on the substrate and the gate by coating $Si_3N_4$ to a thickness of about 200 nm on the substrate and the gate. A channel was formed by coating an oxide semiconductor on a portion of the gate insulating layer corresponding to the gate. A detailed process of forming the channel is as described below. An about 99.99% IZO target that was ordered from Kojundo Chemical Lab. Co., Ltd., Japan having a composition ratio of $In_2O_3$:ZnO=1:2 mol and a 99.9% lanthanum (La) target of LTS company were used. These targets were put into a chamber of a sputtering apparatus (model: MS100) of Varian, Inc., U.S.A.

At room temperature, a gas containing $O_2$ and argon (Ar) gas was supplied in a ratio of $O_2$:Ar=5:95 standard cubic centimeters per minute (sccm) and the pressure of the $O_2$ and Ar gas was maintained at about 5 mTorr. A co-sputtering process was performed by supplying power of about 150 W to the IZO target and supplying power of about 15 W, 20 W, 25 W, and 30 W to the lanthanum (La) target. Thus, a channel having a thickness of about 70 nm was formed by coating an oxide semiconductor thin film including IZO and lanthanum (La) on the gate insulating layer. A source and a drain were formed of titanium/platinum (Ti/Pt) to a thickness of about 10/100 nm on both sides of the channel. Accordingly, an oxide TFT according to example embodiments was formed and a gate voltage Vg and a drain current Id of the oxide TFT were measured.

Figure 4:
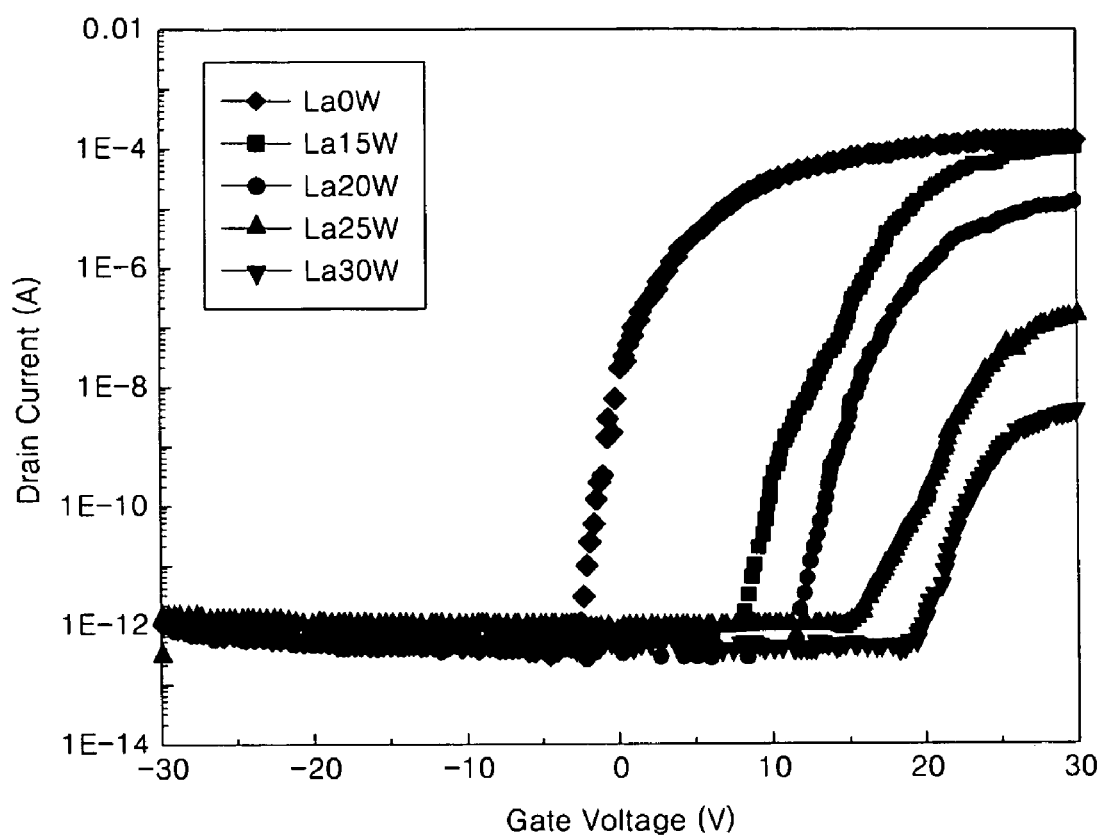

FIG. 4 is a graph showing a correlation between a gate voltage Vg and a drain current Id of the oxide TFT of the above manufacturing example, according to example embodiments. In FIG. 4, in order to control the content of lanthanum (La) when a channel of the oxide TFT is formed by performing a co-sputtering process, power supplied to an IZO target is fixed and only a deposition power of a lanthanum (La) target is controlled. Variations in the gate voltage Vg and the drain current Id with respect to samples formed by supplying about 15 W, 20 W, 25 W, and 30 W to the lanthanum (La) target and a sample formed by not including lanthanum (La) are illustrated in the graph.

Referring to FIG. 4, the channel including IZO to which lanthanum (La) is not added has a voltage of about −2 V and the V on moves toward the right as the deposition power of the lanthanum (La) target increases. When power of about 15 W, 20 W, 25 W, and 30 W are supplied to the lanthanum (La) target, the V on increases to about 8 V, 10 V, 15 V, and 20 V, respectively. When power of about 15 W is supplied to the lanthanum (La) target, the channel has a mobility of about 4.4 cm2/Vs. In all of the samples, an off current Ioff is equal to or less than about 10 pA.

An inductively coupled plasma (ICP)-auger electron spectroscopy (AES) analysis was performed in order to check compositions of oxide semiconductor materials of the above samples.

A sequential spectrometer (model: Shimadzu ICPS-8100) of Shimadzu Corporation, Japan was used as an analyzer. Analysis results of compositions of indium (In), zinc (Zn), and lanthanum (La) of each sample are shown in Table 1.

TABLE 1

| Sample | In/(In + Zn + La) (at %) | Zn/(In + Zn + La) (at %) | La/(In + Zn + La) (at %) |
|---|---|---|---|
| IZO | 53.5 | 46.5 | 0 |
| IZO + La 15 W | 55.4 | 39.3 | 5.3 |
| IZO + La 20 W | 55.5 | 36.6 | 7.9 |
| IZO + La 25 W | 55.3 | 34.4 | 10.3 |
| IZO + La 30 W | 54.4 | 34.2 | 11.4 |

Error Range: ±1%

Referring to Table 1, as power supplied to the lanthanum (La) target increases, the content of lanthanum (La) with respect to IZO increases. When the power supplied to the lanthanum (La) target increases from about 0 W to 30 W, the composition ratio of lanthanum (La) is about 0 at %<La(at %)≦11.4 at %, the composition ratio of In is about 53.5 at %<In(at %)≦55.5 at %, and the composition ratio of zinc (Zn) is about 34.2 at %<Zn(at %)≦46.5 at %. As the composition ratio of lanthanum (La) increases, the composition ratio of In hardly changes and the composition ratio of zinc (Zn) is reduced, because the oxide semiconductor is formed by replacing zinc (Zn) with lanthanum (La).

A composition ratio, a characteristic graph, or mobility characteristics of a deposited thin film may be changed according to, for example, the type of a target, a voltage applied to the target during deposition, deposition equipment, a deposition pressure, an oxygen partial pressure condition, or the temperature of a substrate. For example, a thin film deposited by using two targets, for example, a lanthanum (La) target and an ZnO-based target, e.g., a ZnO target, an IZO target, or a GIZO target, may have a different composition ratio from a thin film deposited by using a single target, e.g., a LnZn oxide target, a LnInZn oxide target, or a LnGaInZn oxide target. Also, even if the composition ratios are the same, thin films may have different characteristics according to deposition conditions. For example, if an oxide semiconductor is deposited through a sputtering process, a resistance range of an oxide may greatly vary according to an oxygen partial pressure. A thin film having a lower resistance may be deposited if the oxygen partial pressure is controlled below an appropriate level, and a thin film having a higher resistance may be deposited if the oxygen partial pressure is higher.

According to example embodiments, one skilled in the art may manufacture various electronic devices, e.g., a driving transistor of a flat panel display apparatus, for example, an LCD apparatus or an OLED apparatus, a transistor for forming a peripheral circuit of a memory device, or an oxide inverter, by using an oxide semiconductor based on example embodiments. An oxide TFT according to example embodiments may be used as a bottom gate TFT or a top gate TFT.

It should be understood that the example embodiments described therein should be considered in a descriptive sense only and not for purposes of limitation. Descriptions of features or aspects within each example embodiment should typically be considered as available for other similar features or aspects in other example embodiments.

What is claimed is:

1. An oxide semiconductor comprising a lanthanoid (Ln) added to a zinc oxide (ZnO)-based material,
wherein a composition ratio of the lanthanoid (Ln) with respect to a total content of the ZnO-based material and the lanthanoid (Ln) is about 0 atomic percentage (at %)<Ln(at %)≦15 at %, and
wherein a composition ratio of zinc (Zn) with respect to a total content of the ZnO-based material and the lanthanoid (Ln) is about 34.2 at %≦Zn(at %)<46.5 at %.

2. The oxide semiconductor of claim 1, wherein the lanthanoid (Ln) comprises at least one selected from the group consisting of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and mixtures thereof.

3. The oxide semiconductor of claim 1, wherein the ZnO-based material comprises ZnO, indium-zinc oxide (IZO), or gallium-indium-zinc oxide (GIZO).

4. The oxide semiconductor of claim 1, wherein the ZnO-based material comprises IZO and the lanthanoid (Ln) comprises lanthanum (La).

5. The oxide semiconductor of claim 4, wherein a composition ratio of lanthanum (La) with respect to a total content of indium (In), zinc (Zn), and lanthanum (La) is about 0 atomic percentage (at %)<La(at %)≦11.4 at %.

6. The oxide semiconductor of claim 5, wherein a composition ratio of indium (In) with respect to a total content of indium (In), zinc (Zn), and lanthanum (La) is about 53.5 at %<In(at %)≦55.5 at %.

7. The oxide semiconductor of claim 1, further comprising:
a Group I element, a Group II element, a Group III element, a Group IV element, or a Group V element.

8. The oxide semiconductor of claim 1, wherein the oxide semiconductor is amorphous.

9. The oxide semiconductor of claim 1, wherein the oxide semiconductor is partially crystalline.

10. The oxide semiconductor of claim 1, wherein the oxide semiconductor is crystalline.

11. An oxide thin film transistor (TFT) comprising:
a gate;
a channel configured to correspond with the gate and including an oxide semiconductor including a lanthanoid (Ln) added to a zinc oxide (ZnO)-based material;
a gate insulating layer between the gate and the channel; and
a source and a drain configured to contact both sides of the channel, respectively,
wherein a composition ratio of lanthanoid (Ln) with respect to a total content of the ZnO-based material and the lanthanoid (Ln) is about 0 atomic percentage (at %)<Ln(at %)≦15 at %, and
wherein a composition ratio of zinc (Zn) with respect to a total content of the ZnO-based material and the lanthanoid (Ln) is about 34.2 at %≦Zn(at %)<46.5 at %.

12. The TFT of claim 11, wherein the lanthanoid (Ln) comprises at least one selected from the group consisting of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and mixtures comprising at least one of the foregoing.

13. The TFT of claim 11, wherein the ZnO-based material comprises ZnO, indium-zinc oxide (IZO), or gallium-indium-zinc oxide (GIZO).

14. The TFT of claim 11, wherein the ZnO-based material comprises IZO and the lanthanoid (Ln) comprises lanthanum (La).

15. The TFT of claim 14, wherein a composition ratio of lanthanum (La) with respect to a total content of indium (In), zinc (Zn), and lanthanum (La) is about 0 atomic percentage (at %)<La(at %)≦11.4 at %.

16. The TFT of claim 15, wherein the composition ratio of indium (In) with respect to a total content of indium (In), zinc (Zn), and lanthanum (La) is about 53.5 at %<In(at %)≦55.5 at %.

17. The TFT of claim 11, wherein the oxide semiconductor further comprises a Group I element, a Group II element, a Group III element, a Group IV element, or a Group V element.

18. The TFT of claim 11, wherein the oxide semiconductor is amorphous.

19. The TFT of claim 11, wherein the oxide semiconductor is partially crystalline.

20. The TFT of claim 11, wherein the oxide semiconductor is crystalline.

* * * * *